United States Patent [19]
Mikoshiba et al.

[11] Patent Number: 6,004,730
[45] Date of Patent: Dec. 21, 1999

[54] METHOD OF FORMING AN INSULATING FILM PATTERN AND PHOTOSENSITIVE COMPOSITION

[75] Inventors: Satoshi Mikoshiba, Yokohama; Yoshihiko Nakano, Tokyo; Rikako Kani; Shuji Hayase, both of Yokohama, all of Japan

[73] Assignee: Kabushiki Kaisha Toshiba, Kawasaki, Japan

[21] Appl. No.: 08/921,613

[22] Filed: Sep. 2, 1997

[30] Foreign Application Priority Data

Sep. 3, 1996 [JP] Japan ................................ 8-233199

[51] Int. Cl.$^6$ ........................................................ G03F 7/26

[52] U.S. Cl. ........................ 430/325; 430/322; 430/330; 525/477; 525/478

[58] Field of Search ..................................... 430/322, 325, 430/326, 330, 311, 270.1; 525/477, 478

[56] References Cited

U.S. PATENT DOCUMENTS

| | | | |
|---|---|---|---|
| 4,770,974 | 9/1988 | Hiraoka et al. | 430/325 |
| 4,822,716 | 4/1989 | Onishi et al. | 430/270.1 |
| 5,238,787 | 8/1993 | Haluska et al. | 430/325 |
| 5,254,439 | 10/1993 | Tani et al. | 430/326 |
| 5,476,753 | 12/1995 | Hashimoto et al. | 430/270.1 |

*Primary Examiner*—Kathleen Duda
*Attorney, Agent, or Firm*—Oblon, Spivak, McClelland, Maier & Neustadt, P.C.

[57] ABSTRACT

There is proposed a method of forming an insulating film pattern, which enables an insulating pattern of high precision and low dielectric constant to be easily obtained by means of an alkali development with basic solution. This method comprises the steps of coating a photosensitive composition comprising a first silicone polymer having a specific monomer and a second silicone polymer having a specific monomer on a substrate thereby to form a film of photosensitive composition, selectively exposing the film of photosensitive composition, alkali-developing the exposed film to form a pattern, and heat-treating the pattern of the photosensitive composition film.

15 Claims, 2 Drawing Sheets

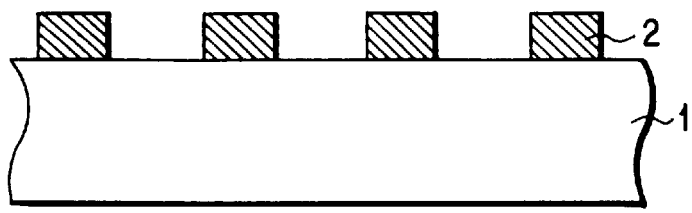
F I G. 1A
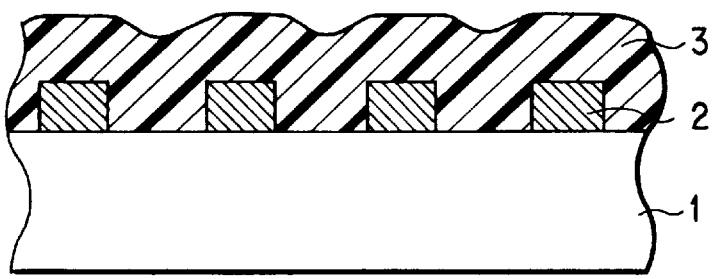
F I G. 1B
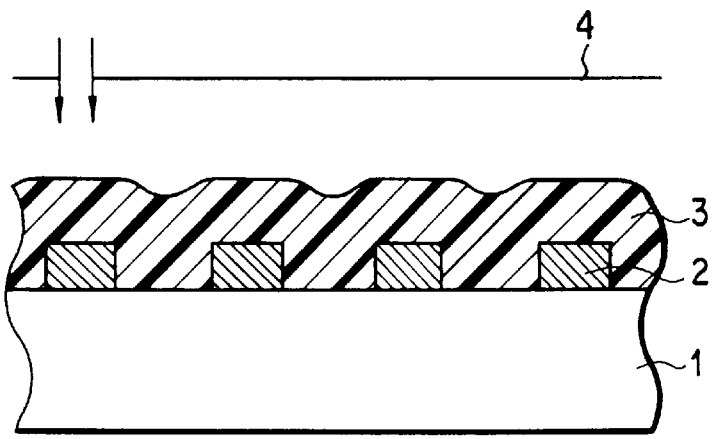
F I G. 1C
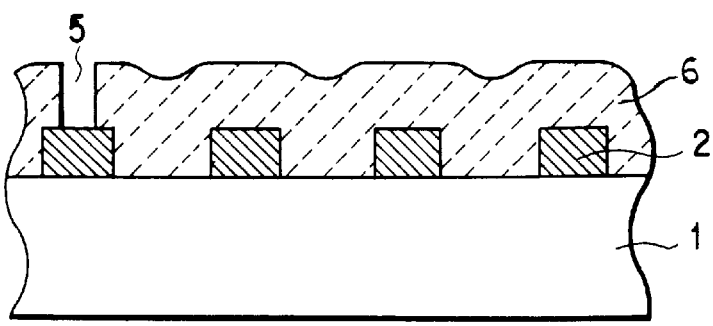
F I G. 1D

METHOD OF FORMING AN INSULATING FILM PATTERN AND PHOTOSENSITIVE COMPOSITION

BACKGROUND OF THE INVENTION

This invention relates to a method of forming an insulating film pattern, which is adapted to be employed in the manufacture of an electronic device such as a semiconductor device and a liquid crystal display device, and also relates to a photosensitive composition.

In the manufacture of a semiconductor device or a liquid crystal display device, an insulating film is required to be formed for insulating a wiring of semiconductor element or of liquid crystal display element from other layers or regions.

As for the method of forming an insulating film to cover the wiring, various methods have been conventionally adopted, e.g. (1) a method of depositing a silicon compound by means of a CVD method; or (2) a method comprising the steps of forming a coating of an organosilica sol of alkoxy-substituted silane such as tetraethoxy silane or of alkoxy-containing siloxane of low molecular weight, and heating the coated layer to dry it.

When an insulating film which has been formed by the aforementioned methods is to be patterned for forming a contact hole for instance, a sequence of procedures, i.e. forming a resist pattern on the insulating film, etching the insulating film with the resist pattern being employed as a mask, and removing the resist pattern are usually required to be undertaken. Namely, these procedures are rather troublesome and lead to an increase in cost for forming an insulating film pattern.

There is also known, as a method of forming a silicon oxide film through coating, a method of forming a silicone polymer by making use of a sol-gel method. According to this method, a silicon oxide film can be obtained by way of heating, but the processes of exposure and development cannot be utilized. Moreover, the film obtained by this method is relatively large in dielectric constant, i.e. about 4.0. The employment of an insulating film having such a high dielectric constant is undesirable in view of a delay in signal propagation velocity that might be caused by a miniaturization of semiconductor element.

BRIEF SUMMARY OF THE INVENTION

Therefore, an object of the present invention is to provide a method which is capable of easily forming an insulating pattern of high precision and low dielectric constant by means of an alkali development with basic solution.

Another object of the present invention is to provide a method which is capable of easily forming an insulating pattern of low dielectric constant by means of a development process.

A still other object of the present invention is to provide a photosensitive composition which is suited for forming the aforementioned insulating film pattern.

Namely, this invention provides a method of forming an insulating film pattern, which comprises the steps of;
coating a photosensitive composition comprising a first silicone polymer having a monomer represented by the following general formula (I) and a second silicone polymer having a monomer represented by the following general formula (II) on a substrate thereby to form a film of photosensitive composition;
selectively exposing and developing the film of photosensitive composition to obtain a pattern of the film of photosensitive composition; and
heat-treating the pattern after the development:

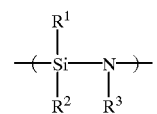

(I)

wherein $R^1$, $R^2$ and $R^3$ may be the same or different and are individually hydrogen atom, a substituted or unsubstituted alkyl group or a substituted or unsubstituted aromatic group;

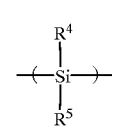

(II)

wherein $R^4$ and $R^5$ may be the same or different and are individually hydrogen atom, a substituted or unsubstituted alkyl group or a substituted or unsubstituted aromatic group.

This invention also provides a method of forming an insulating film pattern, which comprises the steps of;
coating a photosensitive composition comprising a third silicone polymer having a monomer represented by the following general formula (III) and a second silicone polymer having a monomer represented by the following general formula (II) on a substrate thereby to form a film of photosensitive composition;
selectively exposing and developing the film of photosensitive composition to obtain a pattern of the film of photosensitive composition; and
heat-treating the pattern after the development:

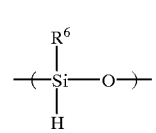

(III)

wherein $R^6$ is hydrogen atom, a substituted or unsubstituted alkyl group, a substituted or unsubstituted aromatic group or a siloxane bond;

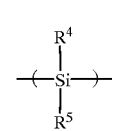

(II)

wherein $R^4$ and $R^5$ may be the same or different and are individually hydrogen atom, a substituted or unsubstituted alkyl group or a substituted or unsubstituted aromatic group.

This invention also provides a method of forming an insulating film pattern, which comprises the steps of;
coating a photosensitive composition comprising a first silicone polymer having a monomer represented by the following general formula (I), a third silicone polymer having a monomer represented by the following general formula (III) and a second silicone polymer having a monomer represented by the following general formula (II) on a substrate thereby to form a film of photosensitive composition;

selectively exposing and developing the film of photosensitive composition to obtain a pattern of the film of photosensitive composition; and heat-treating the pattern after the development:

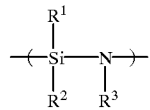

(I)

wherein $R^1$, $R^2$ and $R^3$ may be the same or different and are individually hydrogen atom, a substituted or unsubstituted alkyl group or a substituted or unsubstituted aromatic group;

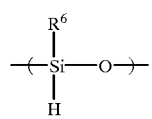

(III)

wherein $R^6$ is hydrogen atom, a substituted or unsubstituted alkyl group, a substituted or unsubstituted aromatic group or a siloxane bond;

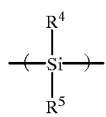

(II)

wherein $R^4$ and $R^5$ may be the same or different and are individually hydrogen atom, a substituted or unsubstituted alkyl group or a substituted or unsubstituted aromatic group.

This invention also provides a method of forming an insulating film pattern, which comprises the steps of;

coating a photosensitive composition comprising a first silicone polymer having a monomer represented by the following general formula (I) and a second silicone polymer having a monomer represented by the following general formula (II) on a substrate thereby to form a film of photosensitive composition;

selectively exposing the film of photosensitive composition and then heat-treating the film of photosensitive composition;

developing the film of photosensitive composition to obtain a pattern of the film of photosensitive composition; and heat-treating the pattern after the development:

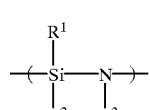

(I)

wherein $R^1$, $R^2$ and $R^3$ may be the same or different and are individually hydrogen atom, a substituted or unsubstituted alkyl group or a substituted or unsubstituted aromatic group;

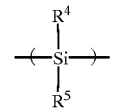

(II)

wherein $R^4$ and $R^5$ may be the same or different and are individually hydrogen atom, a substituted or unsubstituted alkyl group or a substituted or unsubstituted aromatic group.

This invention also provides a method of forming an insulating film pattern, which comprises the steps of;

coating a photosensitive composition comprising a third silicone polymer having a monomer represented by the following general formula (III) and a second silicone polymer having a monomer represented by the following general formula (II) on a substrate thereby to form a film of photosensitive composition;

selectively exposing the film of photosensitive composition and then heat-treating the film of photosensitive composition;

developing the film of photosensitive composition to obtain a pattern of the film of photosensitive composition; and heat-treating the pattern after the development:

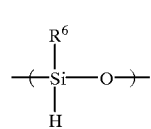

(III)

wherein $R^6$ is hydrogen atom, a substituted or unsubstituted alkyl group, a substituted or unsubstituted aromatic group or a siloxane bond;

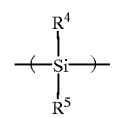

(II)

wherein $R^4$ and $R^5$ may be the same or different and are individually hydrogen atom, a substituted or unsubstituted alkyl group or a substituted or unsubstituted aromatic group.

This invention also provides a method of forming an insulating film pattern, which comprises the steps of;

coating a photosensitive composition comprising a first silicone polymer having a monomer represented by the following general formula (I), a third silicone polymer having a monomer represented by the following general formula (III) and a second silicone polymer having a monomer represented by the following general formula (II) on a substrate thereby to form a film of photosensitive composition;

selectively exposing the film of photosensitive composition and then heat-treating the photosensitive composition;

developing the film of photosensitive composition to obtain a pattern of the photosensitive composition; and heat-treating the pattern after the development:

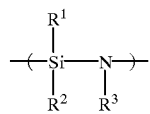
(I)

wherein $R^1$, $R^2$ and $R^3$ may be the same or different and are individually hydrogen atom, a substituted or unsubstituted alkyl group or a substituted or unsubstituted aromatic group;

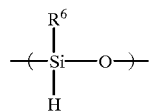
(III)

wherein $R^6$ is hydrogen atom, a substituted or unsubstituted alkyl group, a substituted or unsubstituted aromatic group or a siloxane bond;

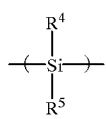
(II)

wherein $R^4$ and $R^5$ may be the same or different and are individually hydrogen atom, a substituted or unsubstituted alkyl group or a substituted or unsubstituted aromatic group.

This invention also provides a method of forming an insulating film pattern, which comprises the steps of;

coating a photosensitive composition comprising at least one kind of silicone polymer selected from a first silicone polymer having a monomer represented by the following general formula (I) and a third silicone polymer having a monomer represented by the following general formula (III) on a substrate thereby to form a film of photosensitive composition;

selectively exposing the film of photosensitive composition and then alkali-developing the film of photosensitive composition; and heat-treating the pattern after the development:

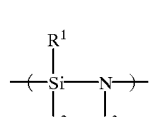
(I)

wherein $R^1$, $R^2$ and $R^3$ may be the same or different and are individually hydrogen atom, a substituted or unsubstituted alkyl group or a substituted or unsubstituted aromatic group;

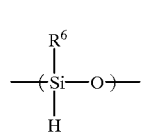
(III)

wherein $R^6$ is hydrogen atom, a substituted or unsubstituted alkyl group, a substituted or unsubstituted aromatic group or a siloxane bond.

This invention also provides a photosensitive composition comprising a first silicone polymer having a monomer represented by the following general formula (I) and a second silicone polymer having a monomer represented by the following general formula (II):

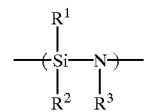
(I)

wherein $R^1$, $R^2$ and $R^3$ may be the same or different and are individually hydrogen atom, a substituted or unsubstituted alkyl group or a substituted or unsubstituted aromatic group;

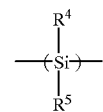
(II)

wherein $R^4$ and $R^5$ may be the same or different and are individually hydrogen atom, a substituted or unsubstituted alkyl group or a substituted or unsubstituted aromatic group.

This invention also provides a photosensitive composition comprising a first silicone polymer having a monomer represented by the following general formula (I), a third silicone polymer having a monomer represented by the following general formula (III) and a second silicone polymer having a monomer represented by the following general formula (II);

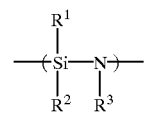
(I)

wherein $R^1$, $R^2$ and $R^3$ may be the same or different and are individually hydrogen atom, a substituted or unsubstituted alkyl group or a substituted or unsubstituted aromatic group;

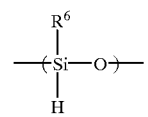
(III)

wherein $R^6$ is hydrogen atom, a substituted or unsubstituted alkyl group, a substituted or unsubstituted aromatic group or a siloxane bond;

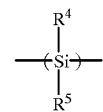
(II)

wherein $R^4$ and $R^5$ may be the same or different and are individually hydrogen atom, a substituted or unsubstituted alkyl group or a substituted or unsubstituted aromatic group.

This invention also provides a photosensitive composition comprising a third silicone polymer having a monomer represented by the following general formula (III) and a fourth silicone polymer having a monomer represented by the following general formula (IV);

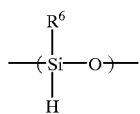
(III)

wherein $R^6$ is hydrogen atom, a substituted or unsubstituted alkyl group, a substituted or unsubstituted aromatic group or a siloxane bond;

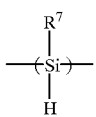
(IV)

wherein $R^7$ is hydrogen atom, a substituted or unsubstituted alkyl group, or a substituted or unsubstituted aromatic group.

This invention also provides a photosensitive composition comprising a first silicone polymer having a monomer represented by the following general formula (I) and a fourth silicone polymer having a monomer represented by the following general formula (IV);

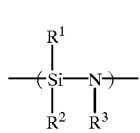
(I)

wherein $R^1$, $R^2$ and $R^3$ may be the same or different and are individually hydrogen atom, a substituted or unsubstituted alkyl group or a substituted or unsubstituted aromatic group;

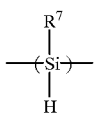
(IV)

wherein $R^7$ is hydrogen atom, a substituted or unsubstituted alkyl group, or a substituted or unsubstituted aromatic group.

The method according to this invention exhibits prominent effects that a photosensitive composition can be developed by means of alkali-development with basic solution, and formed into an insulating film pattern of high precision and low dielectric constant through a reduced number of steps, so that this method is suited for the formation of an insulating film having a contact hole in the manufacture of an electronic device such as a semiconductor device or a liquid crystal display device.

Additionally, the method according to this invention exhibits prominent effects that a photosensitive composition can be developed by means of development treatment, and formed into an insulating film pattern of low dielectric constant through a reduced number of steps, so that this method is suited for the formation of an insulating film having a contact hole in the manufacture of an electronic device such as a semiconductor device or a liquid crystal display device.

Furthermore, it is possible according to this invention to provide a photosensitive composition which is suited for use in the aforementioned formation of insulating film pattern.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1D are cross-sectional views showing a process of forming an insulating film pattern according to Example 1 of this invention.

Figure 2A:
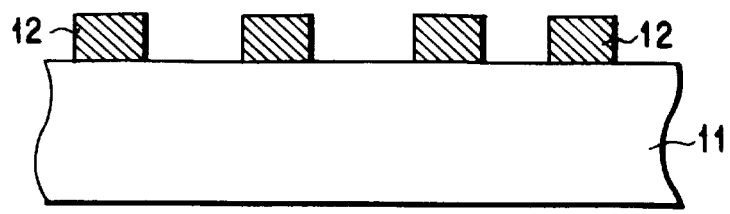
FIGS. 2A to 2D are cross-sectional views showing a process of forming an insulating film pattern according to Example 13 of this invention.

In these FIGS., the reference numeral 11 represents a substrate; 12, a wiring; 13, a film of photosensitive composition; 15, a through-hole; and 16, an insulating film pattern.

DETAILED DESCRIPTION OF THE INVENTION

The expression of "substituted or unsubstituted alkyl group" set forth in this specification means, unless specified otherwise, a linear or branched alkyl group having 1 to 10 carbon atoms, that can be optionally substituted by a halogen atom, hydroxyl group or the like. Specific examples of substituted or unsubstituted alkyl group are methyl, ethyl, n-butyl, isopropyl, n-butyl, sec-butyl, tert-butyl, pentyl (in particular, n-pentyl), hexyl (in particular, n-hexyl), heptyl (in particular, n-heptyl), octyl (in particular, n-octyl), nonyl (in particular, n-nonyl), decyl (in particular, n-decyl), trifluoromethyl and trifluoropropyl.

The expression of "substituted or unsubstituted aromatic group" set forth in this specification means, unless specified otherwise, a monocyclic, bicyclic or tricyclic unfused or fused cyclic aromatic group having 6 to 20 carbon atoms, wherein any optional position of the ring may be optionally mono-substituted or multi-substituted by alkyl (the definition of alkyl is the same as mentioned above, i.e. it includes a substituted or unsubstituted alkyl), cyano, trifluoromethyl, alkoxy group or the like. Specific examples of substituted or unsubstituted aromatic group are phenyl, tolyl, methoxyphenyl, trifluoromethylphenyl, pentafluorophenyl, cyanophenyl, biphenyl, naphthyl, anthryl and phenanthryl.

The expression of "alkoxy group" set forth in this specification means, unless specified otherwise, a linear or branched alkoxy group having 1 to 10 carbon atoms. Specific examples of alkoxy group are methoxy, ethoxy, propoxy, butoxy, pentoxy, hexyloxy, heptyloxy, octyloxy, nonyloxy and decyloxy.

By the expression of halogen atom, it means fluorine, chlorine, bromine or iodine.

Followings are a detailed description on the method of forming an insulating film pattern according to this invention.

First step

Each of the photosensitive compositions (a) to (d) to be explained in detail as follows are coated on the surface of a substrate by means of a spin-coating method, a dipping method, a spray coating method (the spin-coating method being most preferably), and then dried to form a film of photosensitive composition, respectively. The photosensitive composition (a):

This photosensitive composition (a) comprises a first silicone polymer having a monomer represented by the aforementioned general formula (I) and a second silicone polymer having a monomer represented by the aforementioned general formula (II), and is dissolved in an organic solvent thereby being formed into a solution.

As for the first silicone polymer, a homopolymer consisting of a monomer represented by the aforementioned general formula (I) as a repeating unit, or a copolymer comprising a monomer represented by the aforementioned general formula (I) and another kind of monomer which is different from the monomer represented by the aforementioned general formula (I) may be employed. The molecular weight of this first silicone polymer should preferably be in the range of 200 to 100,000, more preferably 200 to 10,000. Namely, if the molecular weight of this first silicone polymer is less than 200, the durability of the insulating film to be obtained would be deteriorated. On the other hand, if the molecular weight of this first silicone polymer is more than 100,000, the solubility in a solvent of the insulating film would be deteriorated. The following compounds (A-1) to (A-50) can be employed as the first silicone polymer.

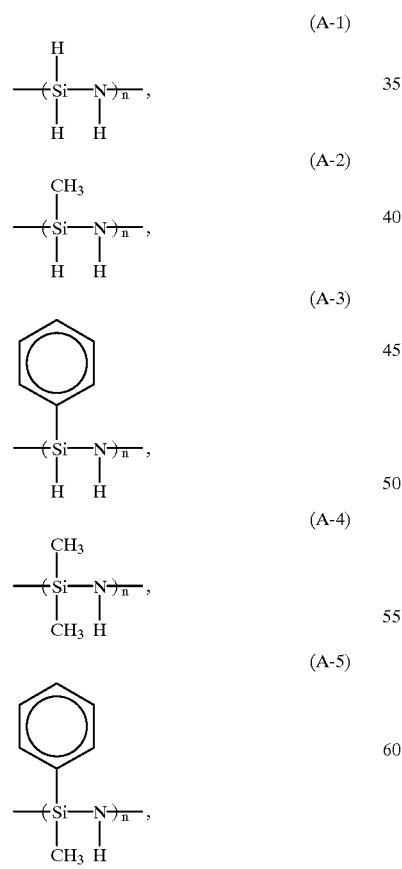

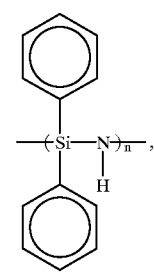

(A-6)

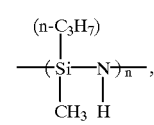

(A-7)

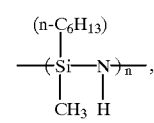

(A-8)

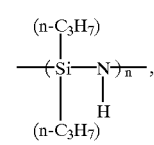

(A-9)

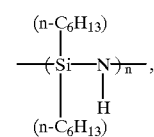

(A-10)

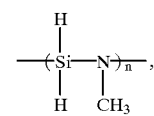

(A-11)

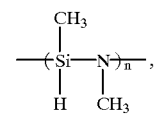

(A-12)

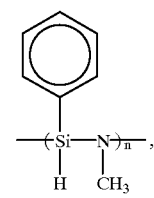

(A-13)

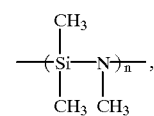

(A-14)

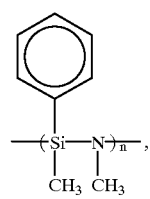 (A-15)
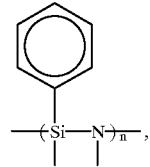 (A-16)
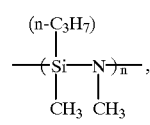 (A-17)
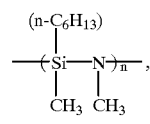 (A-18)
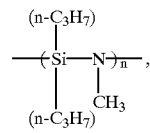 (A-19)
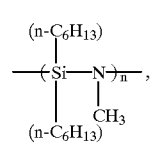 (A-20)
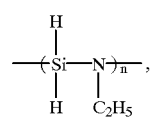 (A-21)
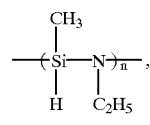 (A-22)
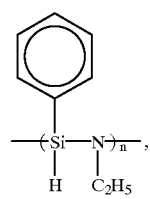 (A-23)
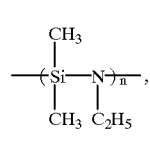 (A-24)
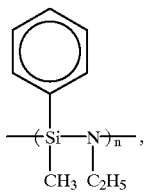 (A-25)
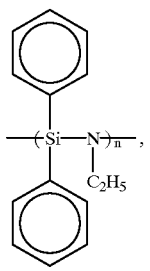 (A-26)
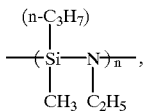 (A-27)
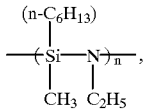 (A-28)
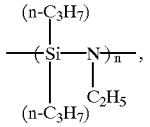 (A-29)
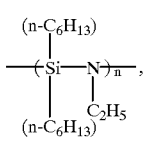 (A-30)
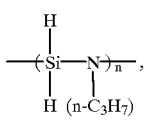 (A-31)
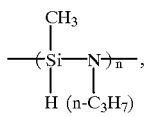 (A-32)
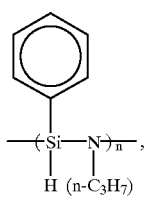 (A-33)

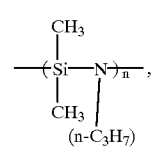
(A-34)
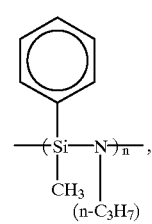
(A-35)
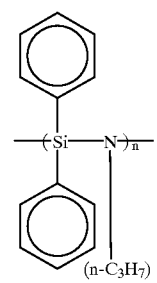
(A-36)
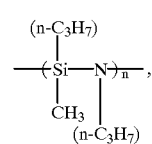
(A-37)
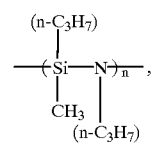
(A-38)
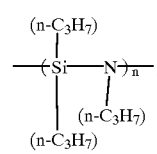
(A-39)
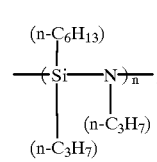
(A-40)
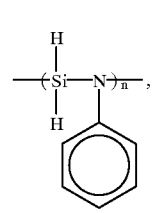
(A-41)
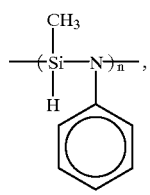
(A-42)
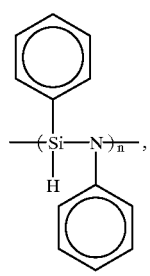
(A-43)
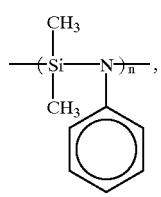
(A-44)
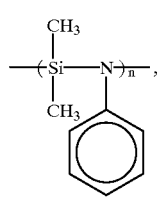
(A-45)
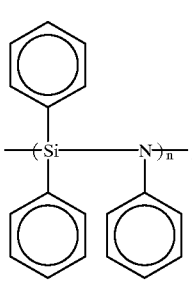
(A-46)
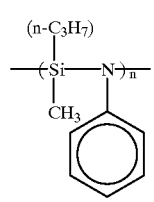
(A-47)
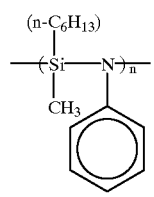
(A-48)

-continued

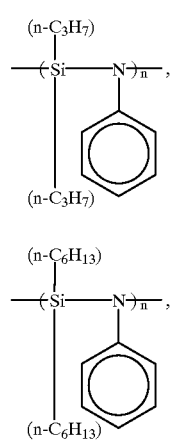

These polymers may be in the form of ring.

Wherein n is an integer matching with the aforementioned range of molecular weight.

As for the second silicone polymer, a homopolymer consisting of a monomer represented by the aforementioned general formula (II) as a repeating unit, or a copolymer comprising a monomer represented by the aforementioned general formula (II) and another kind of monomer which is different from the monomer represented by the aforementioned general formula (II) may be employed. The molecular weight of this second silicone polymer should preferably be in the range of 200 to 100,000, more preferably 200 to 10,000. Namely, if the molecular weight of this second silicone polymer is less than 200, the durability of the insulating film to be obtained would be deteriorated. On the other hand, if the molecular weight of this second silicone polymer is more than 100,000, the solubility in a solvent of the insulating film would be deteriorated. The following compounds (B-1) to (B-24) can be employed as the second silicone polymer. In particular, the employment of the compounds represented by (B-15) to (B-24) (a fourth silicone polymer represented by the aforementioned general formula (IV) wherein H is bonded to Si) are preferable. Since these silicone polymers are capable of generating a large amount of Si radical and silanol group (Si—OH) in the step of exposure to be explained hereinafter, a pattern of high precision can be obtained in an alkali-development with basic solution.

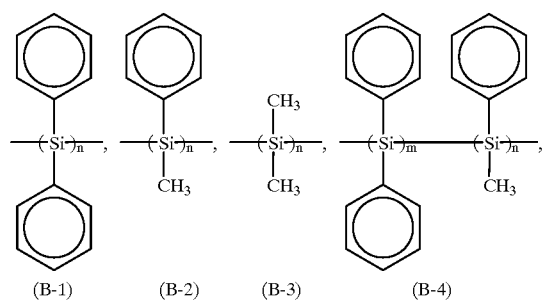

-continued

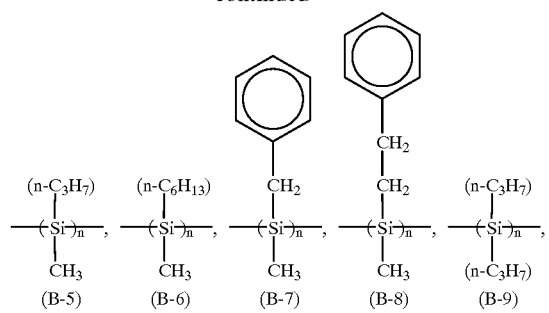

Wherein n and m are respectively an integer matching with the aforementioned range of molecular weight.

The mixing ratio between the first silicone polymer and the second silicon polymer should preferably be in the range of 1:99 to 99:1 (weight ratio) if an insulating film pattern of positive type is to be formed, and in the range of 50:50 to 99.99:0.01 (weight ratio) if an insulating film pattern of negative type is to be formed. As for the organic solvent useful in this case, a hydrocarbon solvent, particularly an aromatic hydrocarbon solvent such as toluene and xylene can be employed.

This photosensitive composition (a) may contain, as a silicone polymer, a copolymer consisting of a monomer represented by the general formula (I) and a monomer represented by the general formula (II). Specific examples of such a copolymer are the following compounds.

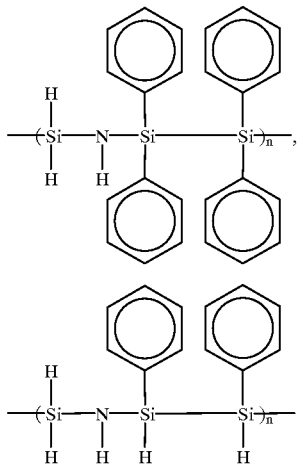

Wherein n is an integer matching with the aforementioned range of molecular weight (i.e. 200–100,000). The photosensitive composition (b):

This photosensitive composition (b) comprises a third silicone polymer having a monomer represented by the aforementioned general formula (III) and a second silicone polymer having a monomer represented by the aforementioned general formula (II), and is dissolved in an organic solvent thereby being formed into a solution.

As for the third silicone polymer, a homopolymer consisting of a monomer represented by the aforementioned general formula (III) as a repeating unit, or a copolymer comprising a monomer represented by the aforementioned general formula (III) and another kind of monomer which is different from the monomer represented by the aforementioned general formula (III) may be employed. The molecular weight of this third silicone polymer should preferably be in the range of 200 to 100,000, more preferably 200 to 10,000. Namely, if the molecular weight of this third silicone polymer is less than 200, the durability of the insulating film to be obtained would be deteriorated. On the other hand, if the molecular weight of this third silicone polymer is more than 100,000, the solubility in a solvent of the insulating film would be deteriorated. The following compounds (C-1) to (C-19) can be employed as the third silicone polymer. One of preferable examples is hydrogensilsesquioxane resin represented by the following formula (C-1).

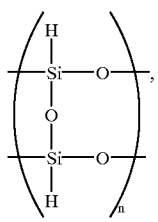
(C-1)

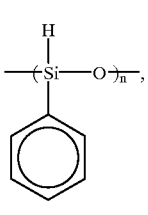
(C-2)

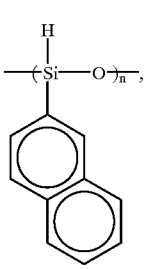
(C-3)

-continued

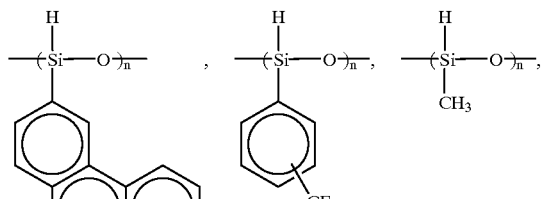
(C-4)   (C-5)   (C-6)

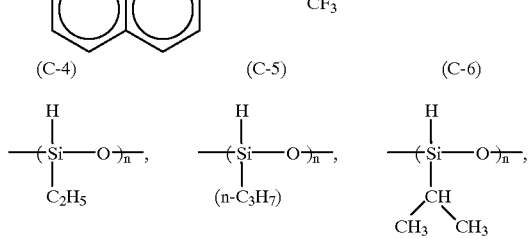
(C-7)   (C-8)   (C-9)

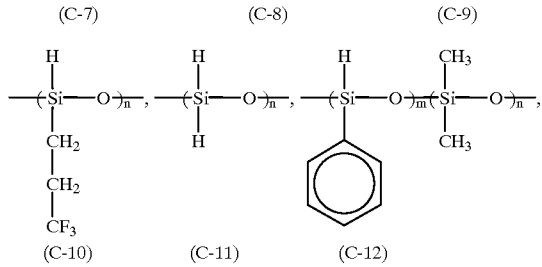
(C-10)   (C-11)   (C-12)

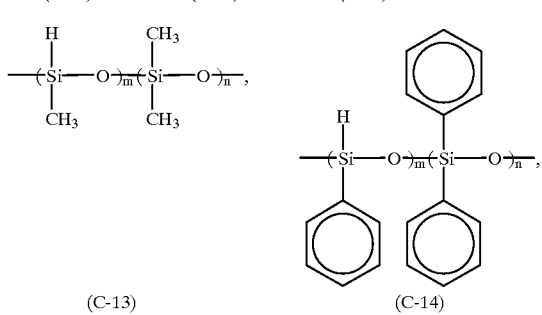
(C-13)   (C-14)

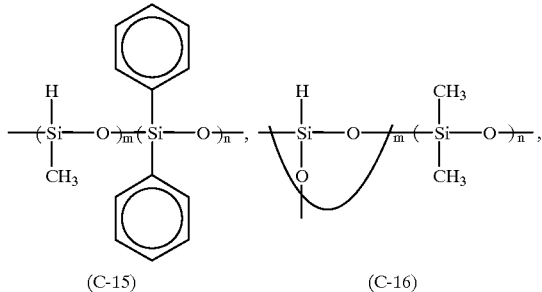
(C-15)   (C-16)

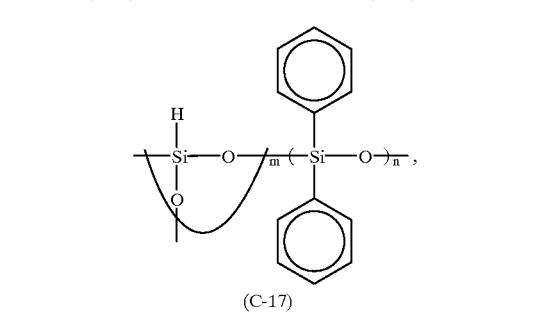
(C-17)

-continued

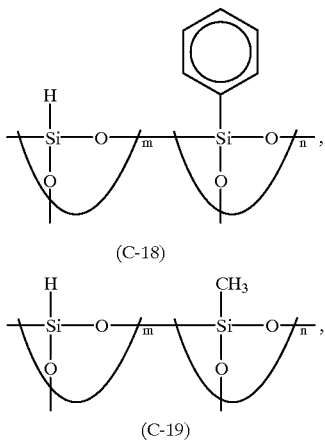

(C-18)

(C-19)

Wherein n and m are respectively an integer matching with the aforementioned range of molecular weight.

As for the second silicone polymer, the same kinds of polymer as explained with reference to the aforementioned photosensitive composition (a) may be employed. In particular, the employment of the compounds represented by (B-15) to (B-24) (a fourth silicone polymer represented by the aforementioned general formula (IV) wherein H is bonded to Si) are preferable. Since these silicone polymers are capable of generating a large amount of Si radical and silanol group (Si—OH) in the step of exposure to be explained hereinafter, a pattern of high precision can be obtained in an alkali-development with basic solution.

The mixing ratio between the third silicone polymer and the second silicon polymer should preferably be in the range of 1:99 to 99:1 (weight ratio) if an insulating film pattern of positive type is to be formed, and in the range of 50:50 to 99.99:0.01 (weight ratio) if an insulating film pattern of negative type is to be formed.

As for the organic solvent useful in this case, a hydrocarbon solvent, particularly an aromatic hydrocarbon solvent such as toluene and xylene can be employed.

This photosensitive composition (b) may contain, as a silicone polymer, a copolymer consisting of a monomer represented by the general formula (III) and a monomer represented by the general formula (II). One of specific examples of such a copolymer is the following compound.

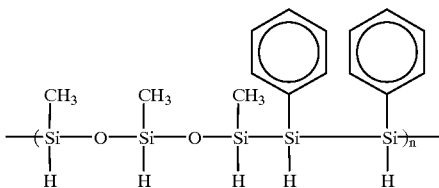

Wherein n is an integer matching with the aforementioned range of molecular weight (i.e. 200–100,000).

The photosensitive composition (c):

This photosensitive composition (c) comprises a first silicone polymer having a monomer represented by the aforementioned general formula (I), a third silicone polymer having a monomer represented by the aforementioned general formula (III) and a second silicone polymer having a monomer represented by the aforementioned general formula (II), and is dissolved in an organic solvent thereby being formed into a solution.

As for the first and second silicone polymers, the same kinds of polymers as explained with reference to the aforementioned photosensitive composition (a) may be employed. In particular, as for the second silicone polymers, the employment of the compounds represented by (B-15) to (B-24) (a fourth silicone polymer represented by the aforementioned general formula (IV) wherein H is bonded to Si) are preferable.

As for the third silicone polymer, the same kinds of polymers as explained with reference to the aforementioned photosensitive composition (b) may be employed. One of preferable examples is hydrogensilsesquioxane resin represented by the aforementioned formula (C-1).

The mixing ratio between a total amount of the first silicone polymer and the third silicone polymer and an amount of the second silicon polymer should preferably be in the range of 99:1 to 1:99 (weight ratio) if an insulating film pattern of positive type is to be formed, and in the range of 50:50 to 99.99:0.01 (weight ratio) if an insulating film pattern of negative type is to be formed.

As for the organic solvent useful in this case, a hydrocarbon solvent, particularly an aromatic hydrocarbon solvent such as toluene and xylene can be employed.

This photosensitive composition (c) may contain, as a silicone polymer, a copolymer consisting of a monomer represented by the general formula (I), a monomer represented by the general formula (III) and a monomer represented by the general formula (II). One of specific examples of such a copolymer is the following compound.

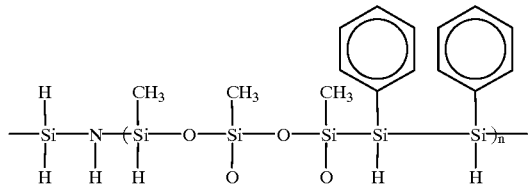

Wherein n is an integer matching with the aforementioned range of molecular weight (i.e. 200–100,000).

The photosensitive composition (d):

This photosensitive composition (d) comprises at least one kind of silicone polymer selected from a first silicone polymer having a monomer represented by the aforementioned general formula (I) and a third silicone polymer having a monomer represented by the aforementioned general formula (III), and is dissolved in an organic solvent thereby being formed into a solution.

As for the first silicone polymer, the same kinds of polymer as explained with reference to the aforementioned photosensitive composition (a) may be employed.

As for the third silicone polymer, the same kinds of polymers as explained with reference to the aforementioned photosensitive composition (b) may be employed. One of preferable examples is hydrogensilsesquioxane resin represented by the aforementioned formula (C-1).

The mixing ratio between the first silicone polymer and the third silicone polymer in this photosensitive composition may be arbitrarily selected.

As for the organic solvent useful in this case, a hydrocarbon solvent, particularly an aromatic hydrocarbon solvent such as toluene and xylene can be employed.

As for the substrate to be employed in this invention, a semiconductor substrate provided on its surface with a wiring or a glass substrate provided on its surface with a wiring may be employed.

The photosensitive compositions (a) to (c) may contain a silicone-based resin or a phenol-based resin where a monomer having a phenol or carboxylic acid residual group or an ether bond is copolymerized with a monomer represented by the general formula (II). The silicone-based resin or phenol-based resin of this kind may be mixed in the photosensitive composition at a ratio of 95 wt % or less, more preferably 10 to 90 wt %. If the mixing ratio of the silicone-based resin or phenol-based resin exceeds over 95 wt %, it may become difficult to form an insulating film pattern of high precision.

Second step

After a film of the photosensitive composition formed on the substrate is selectively exposed, the film is subjected to a developing treatment thereby to form a pattern in the film of the photosensitive composition.

This exposure treatment can be performed preferably by making use of a light having a wavelength of 150 nm to 400 nm, more preferably 190 nm to 300 nm. The dosage of irradiation in this exposure should preferably be in the range of 10 mJ/cm$^2$ to 10 J/cm$^2$, more preferably in the range of 100 mJ/cm$^2$ to 3 J/cm$^2$.

An alkali-developing solution or a developing solution comprising an organic solvent may be employed if the aforementioned photosensitive composition (a) or (c) is employed in this developing process as a photosensitive composition. Whereas, only an alkali-developing solution can be employed if the aforementioned photosensitive composition (b) or (d) is employed in this developing process as a photosensitive composition.

Examples of the alkali-developing solution useful in this case are an aqueous solution of organic amine such as tetramethyl ammonium hydroxide and choline, and an aqueous inorganic alkaline solution such as potassium hydroxide or sodium hydroxide. Examples of the organic solvent useful in this case are a hydrocarbon-based solvent, in particular aromatic hydrocarbon type solvent such as an aromatic solvent (e.g. toluene, xylene); an alcoholic solvent (e.g. methanol, ethanol); a ketone type solvent (acetone, methyl ethyl ketone); and a polar solvent (methyl acetate, ethyl acetate and butyl acetate). However, even if the aforementioned photosensitive composition (a) or (c) is employed in this developing process, the employment of alkali-developing solution is preferable since it would make it possible to suppress the swelling of the pattern and hence to obtain a pattern of high precision.

Third step

After the pattern of photosensitive composition film is entirely subjected to exposure, if required, in subsequent to the development, the pattern is heat-treated to form an insulating film pattern.

In this entire exposure, a light of the same wavelength as that employed in the selective exposure can be employed.

The heat treatment can be performed preferably at a temperature of 100 to 600° C., more preferably 200 to 500° C.

The substrate bearing thereon the pattern of photosensitive composition film may be immersed in a sol of metal (such as Zr, Al and Ti) alkoxide after this entire light exposure but before the aforementioned heat treatment.

When the photosensitive compositions (a) to (c) are respectively coated on a substrate and selectively exposed to light after being dried, according to this invention as mentioned above, Si radical and silanol group (Si—OH) are caused to generate selectively from the second silicone polymer included in each of the photosensitive compositions (a) to (c), and containing a monomer represented by the aforementioned general formula (II).

When the mixing amount of the second silicone polymer in these photosensitive compositions (a) to (c) is relatively small, other components, i.e. the first silicone polymer containing a monomer represented by the general formula (I) and/or the third silicone polymer containing a monomer represented by the general formula (III) are caused to cross-link at the light-exposed portion due to the action of the aforementioned Si radical, so that the light-exposed portion becomes insoluble to the developing solution and the unexposed portion becomes soluble to the developing solution. As a result, through a development treatment using an aqueous alkali-solution or an organic solvent after the light exposure, the non-exposed portion of the photosensitive composition film is selectively dissolved and removed, thus forming a negative pattern of the photosensitive composition film. By the way, when the photosensitive composition (b) is employed, an aqueous alkali-solution is required to be employed as a developing solution.

On the other hand, when the mixing amount of the second silicone polymer in these photosensitive compositions (a) to (c) is relatively large, the solubility to the developing solution of the silanol group (Si—OH) that has been generated by the light exposure becomes predominant, so that the light-exposed portion can be selectively dissolved and removed in the subsequent developing treatment using an aqueous alkali-solution or an organic solvent, whereby producing a positive pattern of the photosensitive composition film. By the way, when the photosensitive composition (b) is employed in this case, an aqueous alkali-solution is required to be employed as a developing solution.

If required, each pattern of the photosensitive composition film may be entirely exposed to light after the developing treatment thereby allowing the silanol group (Si—OH) to be produced entirely, and then the photosensitive composition film is subjected to a heat treatment thereby allowing a siloxane bond (Si—O—Si) having a high crosslinking density to be produced all over the pattern. If this heat treatment is performed in a nitrogen atmosphere, a (Si—N) bond would be left remain.

Thus, it is possible, with this heat treatment after the formation of pattern of photosensitive composition film, to easily obtain an insulating film pattern of high precision, which is formed of a glass matrix pattern, exhibits a low dielectric constant, and is excellent in adhesivity to a substrate and in heat resistance. Furthermore, when an alkali-development with basic solution is employed in this case, the swelling of pattern of the photosensitive composition film can be suppressed, thereby making it possible to easily obtain an insulating film pattern of high precision.

When the second silicone polymer constituting one of the components of the photosensitive compositions (a) to (c) is a compound where H is bonded to Si of the silicon polymer, a large amount of Si radical and silanol group (Si—OH) is generated from the compound (i.e. a second silicone polymer) during the exposure thereof, so that the crosslinking degree at the light-exposed portion can be enhanced in the occasion of forming a negative pattern, and at the same time, the solubility to a developing solution (preferably, an aqueous alkali-solution) of the light-exposed portion is enhanced in the occasion of forming a positive pattern. As a result, it has become possible, through this developing treatment after exposure, to obtain a negative pattern of photosensitive composition film having a high precision and also a positive pattern of photosensitive composition film having a high precision.

Furthermore, when the third silicone polymer containing a monomer represented by the general formula (III) is hydrogensilsesquioxane resin represented by the aforementioned formula (C-1), and at the same time, the second silicone polymer is one of the compounds represented by (B-15) to (B-24) (a fourth silicone polymer represented by the aforementioned general formula (IV) wherein H is bonded to Si) (which are exemplified in the explanation of the formula II) in the photosensitive composition (b), a large amount of Si radical and silanol group (Si—OH) is generated not only from the second silicone polymer but also from the third silicone polymer during the exposure thereof, so that it is possible to obtain, through the development (through an alkali-development with basic solution in particular) thereof, a pattern of photosensitive composition film which is far excellent in precision.

When the pattern of photosensitive composition film is immersed in a sol of metal (such as Zr, Al and Ti) alkoxide after the entire exposure but before the aforementioned heat treatment, the silanol group (Si—OH) generated by the entire exposure is caused to bond with a metal such as zirconium, aluminum or titanium. As a result, it is possible with a subsequent heat treatment to obtain an insulating pattern which is extremely high in crosslinking density and further improved in adhesion to a substrate and in heat resistance.

On the other hand, when the photosensitive composition (d) is coated on a substrate, and selectively exposed to light after being dried, the first silicone polymer containing a monomer represented by the general formula (I) and/or the third silicone polymer containing a monomer represented by the general formula (III) are caused to cross-link at the light-exposed portion, so that the light-exposed portion becomes insoluble to an aqueous alkali-solution and the unexposed portion becomes soluble to the aqueous alkali-solution. As a result, through a development treatment using an aqueous alkali-solution after the light exposure, the non-exposed portion of the photosensitive composition film is selectively dissolved and removed, thus forming a negative pattern of the photosensitive composition film.

When a pattern of the photosensitive composition film is subjected to a heat treatment after the development treatment, a siloxane bond (Si—O—Si) having a high crosslinking density is produced all over the pattern. If this heat treatment is performed in a nitrogen atmosphere, a (Si—N) bond would be left remain.

Thus, it is possible, with an employment of alkali-development with basic solution to suppress the swelling of pattern of photosensitive composition film as well as with a heat treatment after the formation of pattern of photosensitive composition film, to easily obtain an insulating film pattern of high precision, which is formed of a glass matrix pattern, exhibits a low dielectric constant, and is excellent in adhesivity to a substrate and in heat resistance.

Especially, when a photosensitive composition containing hydrogensilsesquioxane resin represented by the aforementioned formula (C-1) is employed as the third silicone polymer containing a monomer represented by the general formula (III), the generation of Si radical can be increased during the exposure thereof, so that it is possible to increase the cross-linking degree, thus making it possible to obtain, through an alkali-development thereof with basic solution, a pattern of photosensitive composition film which is far excellent in precision.

Next, another method of forming an insulating film pattern according to this invention will be explained.

First step

Each of the aforementioned photosensitive compositions (a) to (c) are coated on the surface of a substrate by means of a spin-coating method, a dipping method, a spray coating method (the spin-coating method being most preferably), and then dried to form a film of photosensitive composition, respectively.

The photosensitive compositions (a) to (c) may contain an organometallic compound. Examples of the organometallic compound are a metal attached directly with any of various kinds of organic group, wherein the metal may be aluminum, titanium, chromium, zirconium, copper, iron, manganese, nickel, vanadium or cobalt, and a complex of said metal. Among these organometallic compounds, an organozirconium compound, an organoaluminum compound and an organotitanium compound are particularly useful. Especially, a complex compound where (1) alkoxy group, (2) phenoxy group, (3) acyloxy ligand, (4) b-diketone ligand, or (5) o-carbonyl phenolate ligand, which are to be further explained below, is bonded to a metal atom is preferable.

(1) Alkoxyl group:

Alkoxyl groups having 1 to 10 carbon atoms are preferable. For example, methoxy group, isopropoxy group or pentoxy group may be preferably employed.

(2) Phenoxy group:

For example, phenoxy group, o-methylphenoxy group, o-methoxyphenoxy group, p-nitrophenoxy group and 2,6-dimethylphenoxy group may be preferably employed.

(3) Acyloxy ligand:

For example, acetato, propionato, isopropinato, butylato, stearato, ethylacetoacetato, propylacetoacetato, butylacetoactato, diethylmalato and dipivaloylmethanato may be preferably employed.

(4) b-diketone ligand:

For example, acetylacetonato, trifluoroacetyl acetonato, hexafluoroacetyl acetonato and ligands of (D-1) to (D-3) shown below may be preferably employed.

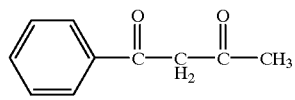

(D-1)

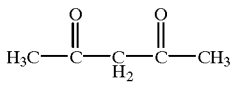

(D-2)

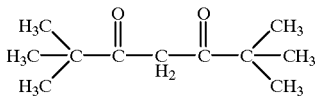

(D-3)

(5) o-carbonyl phenolate ligand:

For example, salicylaldehydato may be preferably employed.

Examples of organoaluminum compound are trismethoxy aluminum, triethoxy aluminum, triisopropoxy aluminum, trisphenoxy aluminum, trisparamethylphenoxy aluminum, isopropoxydiethoxy aluminum, trisbutoxy aluminum, trisacetoxy aluminum, trisisouropionato aluminum, trisacetyl acetonato aluminum, tristrifluoroacetyl acetonato aluminum, trishexafluoroacetyl acetonato aluminum, trisethylacetyl acetonato aluminum, trisdiethylfumarato aluminum, trispropylacetyl acetonato aluminum, trisbutyl acetoacetanato aluminum, trisdipivaloylmetanato aluminum, diacetylacetonatodipivaloylmetanato aluminum, and the compounds of (E-1) to (E-6) shown below.

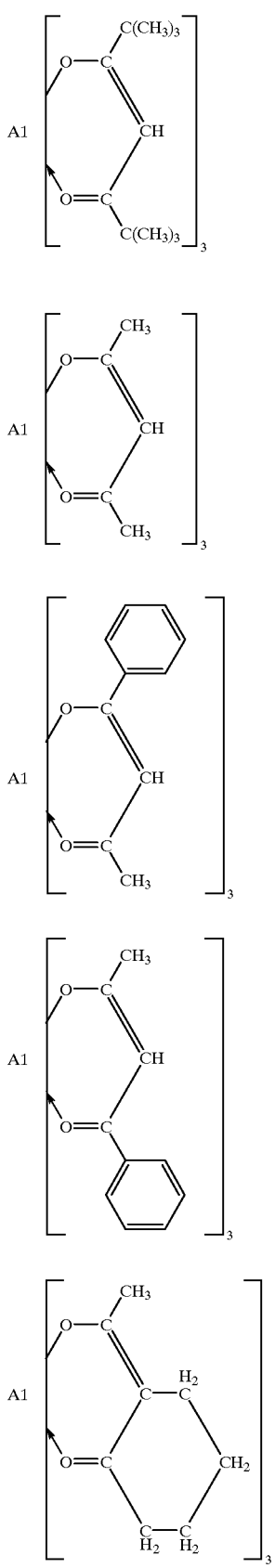

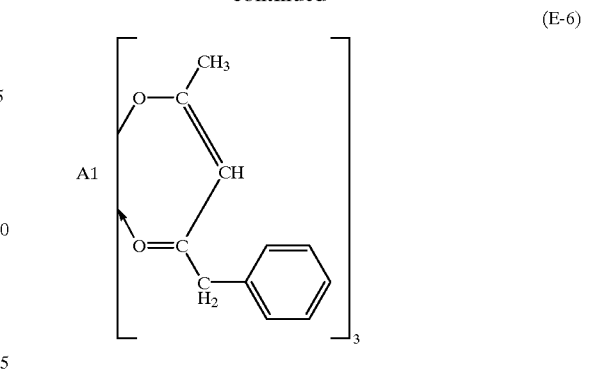

Second step

After a film of the photosensitive composition formed on the substrate is selectively exposed, the film is subjected to a heat treatment and to a developing treatment using an organic solvent thereby to form a negative insulating film pattern. If required, the resultant insulating film pattern may be further heat-treated.

This exposure treatment can be performed preferably by making use of a light having a wavelength of 150 nm to 400 nm, more preferably 200 nm to 300 nm. The dosage of irradiation in this exposure should preferably be in the range of 10 mJ/cm$^2$ to 10 J/cm$^2$, more preferably in the range of 100 mJ/cm$^2$ to 3 J/cm$^2$.

The heat treatment should preferably be performed at a temperature ranging from 100° C. to 150° C.

Examples of the organic solvent useful in this case are a hydrocarbon-based solvent, in particular aromatic hydrocarbon type solvent such as an aromatic solvent (e.g. toluene, xylene); an alcoholic solvent (e.g. methanol, ethanol); a ketone type solvent (acetone, methyl ethyl ketone); and a polar solvent (methyl acetate, ethyl acetate and butyl acetate).

The heat treatment after the formation of the insulating film pattern should preferably be performed at a temperature ranging from 100° C. to 600° C., preferably 400° C. to 500° C.

When the photosensitive compositions (a) to (c) are respectively coated on a substrate and selectively exposed to light after being dried, according to another method of this invention as mentioned above, silanol group (Si—OH) are caused to generate selectively from the second silicone polymer included in each of the photosensitive compositions (a) to (c), and containing a monomer represented by the aforementioned general formula (II).

By the heat treatment at a relatively low temperature (for example, 100 to 150° C.) in subsequent to exposure treatment, the silanol group (Si—OH) is selectively cross-linked, thereby producing siloxane bond (Si—O—Si) having a sufficiently high cross-linking density at the light-exposed portion, thus making it insoluble to an organic solvent, i.e. making it possible to perform a selective dissolution between the non-exposed portion and the exposed portion. Consequently, when a development is performed using an organic solvent, the non-exposed portion of the photosensitive composition film is selectively dissolved and removed, thus forming a negative insulating film pattern. Subsequently, the insulating film pattern is subjected to a heat treatment at a relatively high temperature (for example, 400 to 500° C.), thereby allowing a siloxane bond (Si—O—Si) having a high crosslinking density to be produced all over the pattern. If this heat treatment is performed in a nitrogen atmosphere, a (Si—N) bond would be left remain.

Thus, it is possible to easily obtain an insulating film pattern of high precision, which is formed of a glass matrix pattern exhibits a low dielectric constant, and is excellent in adhesivity to a substrate and in heat resistance.

Furthermore, since an organometallic compound is incorporated into the photosensitive composition, the linkage thereof can be easily opened upon receiving the light (for example, ultraviolet rays) in the exposure process so as to be bonded with Si—O. Accordingly, the organometallic compound functions not only as a catalyst for enlarging the exposure sensitivity or exposure wave-length region, but also as a cross-linking agent. As a result, it is possible to form an insulating film pattern of high precision, exhibiting an improved adhesivity to a substrate.

By the way, the aforementioned method of forming a pattern and photosensitive composition are applicable not only to the formation of an insulating pattern but also to the formation of a silicon-based multi-layer resist.

Next, the photosensitive composition according to this invention will be explained.

A first photosensitive composition according to this invention is featured in that it comprises a first silicone polymer having a monomer represented by the following general formula (I) and a second silicone polymer having a monomer represented by the following general formula (II):

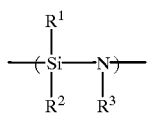
(I)

wherein $R^1$, $R^2$ and $R^3$ may be the same or different and are individually hydrogen atom, a substituted or unsubstituted alkyl group or a substituted or unsubstituted aromatic group;

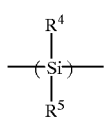
(II)

wherein $R^4$ and $R^5$ may be the same or different and are individually hydrogen atom, a substituted or unsubstituted alkyl group or a substituted or unsubstituted aromatic group.

This composition corresponds to the photosensitive composition (a) which has been explained above with reference to the method of forming a pattern.

Accordingly, the compounds of these general formulas (I) and (II) are the same as explained in the item of the photosensitive composition (a), i.e. the mixing ratio, preferable compounds are the same as explained in the item of the photosensitive composition (a).

A second photosensitive composition according to this invention is featured in that it comprises a first silicone polymer having a monomer represented by the following general formula (I), a third silicone polymer having a monomer represented by the following general formula (III) and a second silicone polymer having a monomer represented by the following general formula (II);

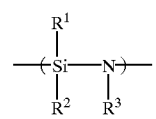
(I)

wherein $R^1$, $R^2$ and $R^3$ may be the same or different and are individually hydrogen atom, a substituted or unsubstituted alkyl group or a substituted or

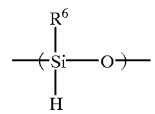
(III)

wherein $R^6$ is hydrogen atom, a substituted or unsubstituted alkyl group, a substituted or unsubstituted aromatic group or a siloxane bond;

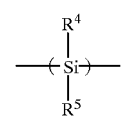
(II)

wherein $R^4$ and $R^5$ may be the same or different and are individually hydrogen atom, a substituted or unsubstituted alkyl group or a substituted or unsubstituted aromatic group.

This composition corresponds to the photosensitive composition (c) which has been explained above with reference to the method of forming a pattern.

Accordingly, the compounds of these general formulas (III), (II) and (I) are the same as explained in the item of the photosensitive composition (c), i.e. the mixing ratio, etc. are the same as explained in the item of the photosensitive composition (c).

A third photosensitive composition according to this invention is featured in that it comprises a third silicone polymer having a monomer represented by the following general formula (III) and a fourth silicone polymer having a monomer represented by the following general formula (IV);

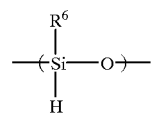
(III)

wherein $R^6$ is hydrogen atom, a substituted or unsubstituted alkyl group, a substituted or unsubstituted aromatic group or a siloxane bond;

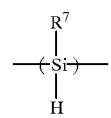
(IV)

wherein $R^7$ is hydrogen atom, a substituted or unsubstituted alkyl group, or a substituted or unsubstituted aromatic group.

This composition is the same as that of the first photosensitive composition except that at least one of substituent groups in the compound of general formula (II) is replaced by hydrogen atom.

Thus, this composition may be said as being a preferable example of the aforementioned photosensitive composition (a). Namely, when this composition is employed, the generation of Si radical and silanol group (Si—OH) in the exposure step in the method of forming a pattern can be further increased.

A fourth photosensitive composition according to this invention is featured in that it comprises a first silicone polymer having a monomer represented by the following general formula (I) and a fourth silicone polymer having a monomer represented by the following general formula (IV);

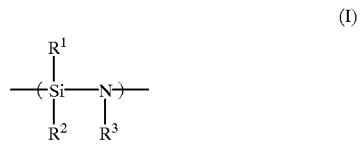
(I)

wherein $R^1$, $R^2$ and $R^3$ may be the same or different and are individually hydrogen atom, a substituted or unsubstituted alkyl group or a substituted or unsubstituted aromatic group;

(IV)

wherein $R^7$ is hydrogen atom, a substituted or unsubstituted alkyl group, or a substituted or unsubstituted aromatic group.

This composition is the same as that of the second photosensitive composition except that at least one of substituent groups in the compound of general formula (II) is replaced by hydrogen atom.

Thus, this composition may be said as being a preferable example of the aforementioned photosensitive composition (c). Namely, when this composition is employed, the generation of Si radical and silanol group (Si—OH) in the exposure step in the method of forming a pattern can be further increased.

Any of the aforementioned compositions may contain the aforementioned organometallic compound. When the aforementioned organometallic compound is incorporated in these compositions, it is possible to provide compositions which are capable of forming a pattern of high precision.

The substituent groups of the compounds represented by the aforementioned general formulas (I), (II), (III) and (IV), which are employed in the composition of this invention are the same as explained above.

EXAMPLES

This invention will be further explained with reference to the following preferred examples.

Example 1

10 g of silicone polymer represented by the aforementioned (A-1) and having an average molecular weight of 10,000 and 10 g of silicone polymer represented by the aforementioned (B-15) and having an average molecular weight of 4,000 were dissolved in xylene to prepare a 20% solution of silicone polymer (a photosensitive composition).

On the other hand, as shown in FIG. 1A, an aluminum wiring 2 having a thickness of 1 μm and a width of 2 μm was formed at intervals of 2 μm on a substrate 1. Then, the aforementioned photosensitive composition was spin-coated on the substrate 1 provided with the aluminum wiring 2 as shown in FIG. 1B and dried to form a photosensitive composition film 3 having a thickness of 2 μm.

Then, as shown in FIG. 1C, ultraviolet rays were irradiated from a low pressure mercury lamp at a dosage of 500 mJ/cm$^2$ onto the surface of the photosensitive composition film 3 through a mask pattern 4, thereby performing a selective exposure of the photosensitive composition film 3. Thereafter, the photosensitive composition film 3 was developed in a 2.38 wt. % aqueous solution of tetramethyl ammonium hydroxide at a temperature of 25° C. for 40 seconds thereby to remove the exposed portion, thus obtaining a positive pattern. Then, the pattern was rinsed with pure water and thermally dried. Then, ultraviolet rays were irradiated again from a low pressure mercury lamp at a dosage of 1 J/cm$^2$ onto the entire upper surface of the photosensitive composition film 3, and then heat-treated at a temperature of 450° C. for one hour, thereby obtaining an insulating film pattern 6 which was formed of a glass matrix and provided, at a portion corresponding with the location of wiring 2, with a through-hole 5 having a dimension of 0.7 μm×1 μm as shown in FIG. 1D.

The insulating film pattern 6 thus obtained was found free from cracking or swelling, adhering firmly onto the substrate 1. Further, any sign of reflow was not recognized around the opening of the through-hole 5. The specific resistance of the insulating film pattern 6 was found as being 5×10$^{14}$ Ωcm.

Example 2

After ultraviolet rays were irradiated onto the entire upper surface of the photosensitive composition film in the same manner as illustrated in Example 1, the photosensitive composition film was immersed in a sol of aluminum alkoxide and then heat-treated at a temperature of 450° C. for one hour. As a result, the insulating film pattern adhering more firmly onto the substrate as compared with that of Example 1 was obtained.

Example 3

10 g of silicone polymer represented by the aforementioned (A-1) and having an average molecular weight of 10,000 and 0.2 g of silicone polymer represented by the aforementioned (B-15) and having an average molecular weight of 4,000 were dissolved in xylene to prepare a 20% solution of silicone polymer (a photosensitive composition).

On the other hand, an aluminum wiring having a thickness of 1 μm and a width of 2 μm was formed at intervals of 2 μm on a substrate. Then, the aforementioned photosensitive composition was spin-coated on the substrate provided with the aluminum wiring and dried to form a photosensitive composition film having a thickness of 2 μm.

Then, ultraviolet rays were irradiated from a low pressure mercury lamp at a dosage of 500 mJ/cm$^2$ onto the surface of the photosensitive composition film through a mask pattern, thereby performing a selective exposure of the photosensitive composition film. Thereafter, the photosensitive composition film was developed in a 2.38 wt. % aqueous solution of tetramethyl ammonium hydroxide at a temperature of 25° C. for 40 seconds thereby to remove the non-exposed portion, thus obtaining a negative pattern. Then, the pattern was rinsed with pure water and thermally dried. Then, ultraviolet rays were -irradiated again from a low pressure mercury lamp at a dosage of 1 J/cm² onto the entire upper surface of the photosensitive composition film, and then heat-treated at a temperature of 450° C. for one hour, thereby obtaining an insulating film pattern which was formed of a glass matrix and provided, at a portion corresponding with the location of wiring, with a through-hole having a dimension of 0.7 μm×1 μm.

The insulating film pattern thus obtained was found free from cracking or swelling, adhering firmly onto the substrate. Further, any sign of reflow was not recognized around the opening of the through-hole. The specific resistance of the insulating film pattern was found as being $5 \times 10^{14}$ Ωcm.

Example 4

10 g of silicone polymer represented by the aforementioned (A-1) and having an average molecular weight of 300 and 10 g of silicone polymer represented by the aforementioned (B-15) and having an average molecular weight of 4,000 were dissolved in xylene to prepare a 20% solution of silicone polymer (a photosensitive composition).

On the other hand, as shown in FIG. 1A, an aluminum wiring 2 having a thickness of 1 μm and a width of 2 μm was formed at intervals of 2 μm on a substrate 1. Then, the aforementioned photosensitive composition was spin-coated on the substrate 1 provided with the aluminum wiring 2 as shown in FIG. 1B and dried to form a photosensitive composition film 3 having a thickness of 2 μm.

Then, as shown in FIG. 1C, ultraviolet rays were irradiated from a low pressure mercury lamp at a dosage of 500 mJ/cm² onto the surface of the photosensitive composition film 3 through a mask pattern 4, thereby performing a selective exposure of the photosensitive composition film 3. Thereafter, the photosensitive composition film 3 was developed in a 2.38 wt. % aqueous solution of tetramethyl ammonium hydroxide at a temperature of 25° C. for 40 seconds thereby to remove the exposed portion, thus obtaining a positive pattern. Then, the pattern was rinsed with pure water and thermally dried. Then, ultraviolet rays were irradiated again from a low pressure mercury lamp at a dosage of 1 J/cm² onto the entire upper surface of the photosensitive composition film 3, and then heat-treated at a temperature of 450° C. for one hour, thereby obtaining an insulating film pattern 6 which was formed of a glass matrix and provided, at a portion corresponding with the location of wiring 2, with a through-hole 5 having a dimension of 0.7 μm×1 μm as shown in FIG. 1D.

The insulating film pattern 6 thus obtained was found free from cracking or swelling, adhering firmly onto the substrate 1. Further, any sign of reflow was not recognized around the opening of the through-hole 5. The specific resistance of the insulating film pattern 6 was found as being $5 \times 10^{14}$ Ωcm.

Example 5

After ultraviolet rays were irradiated onto the entire upper surface of the photosensitive composition film in the same manner as illustrated in Example 4, the photosensitive composition film was immersed in a sol of aluminum alkoxide and then heat-treated at a temperature of 450° C. for one hour. As a result, the insulating film pattern adhering more firmly onto the substrate as compared with that of Example 4 was obtained.

Example 6

10 g of silicone polymer represented by the aforementioned (A-3) and having an average molecular weight of 3,000 and 0.2 g of silicone polymer represented by the aforementioned (B-15) and having an average molecular weight of 4,000 were dissolved in xylene to prepare a 20% solution of silicone polymer (a photosensitive composition).

On the other hand, an aluminum wiring having a thickness of 1 μm and a width of 2pm was formed at intervals of 2 μm on a substrate. Then, the aforementioned photosensitive composition was spin-coated on the substrate provided with the aluminum wiring and dried to form a photosensitive composition film having a thickness of 2 μm.

Then, ultraviolet rays were irradiated from a low pressure mercury lamp at a dosage of 500 mJ/cm² onto the surface of the photosensitive composition film through a mask pattern, thereby performing a selective exposure of the photosensitive composition film. Thereafter, the photosensitive composition film was developed in a 2.38 wt. % aqueous solution of tetramethyl ammonium hydroxide at a temperature of 25° C. for 40 seconds thereby to remove the non-exposed portion, thus obtaining a negative pattern. Then, the pattern was rinsed with pure water and thermally dried. Then, ultraviolet rays were irradiated again from a low pressure mercury lamp at a dosage of 1 J/cm² onto the entire upper surface of the photosensitive composition film, and then heat-treated at a temperature of 450° C. for one hour, thereby obtaining an insulating film pattern which was formed of a glass matrix and provided, at a portion corresponding with the location of wiring, with a through-hole having a dimension of 0.7 μm×1 μm.

The insulating film pattern thus obtained was found free from cracking or swelling, adhering firmly onto the substrate. Further, any sign of reflow was not recognized around the opening of the through-hole. The specific resistance of the insulating film pattern was found as being $5 \times 10^{14}$ Ωcm.

Example 7

10 g of silicone polymer represented by the aforementioned (C-1) and having an average molecular weight of 9,000 and 0.2 g of silicone polymer represented by the aforementioned (B-15) and having an average molecular weight of 4,000 were dissolved in methylisobutyl ketone to prepare a 20% solution of silicone polymer (a photosensitive composition).

Then, the photosensitive composition thus obtained was spin-coated on a silicon wafer and baked at a temperature of 100° C. for one minute to form a photosensitive composition film having a thickness of 2 μm.

ArF laser beam was then irradiated at a dosage of 500 mJ/cm² onto the surface of the photosensitive composition film, thereby performing a selective exposure of the photosensitive composition film. Thereafter, the photosensitive composition film was developed in a 2.38 wt. % aqueous solution of tetramethyl ammonium hydroxide at a temperature of 25° C. for one minute thereby to remove the non-exposed portion, thus obtaining a negative pattern having a width of 2 μm. The pattern was then heat-treated at a temperature of 300° C. for one hour, thereby obtaining an insulating film pattern which was formed of a glass matrix containing siloxane bond.

The insulating film pattern thus obtained was found free from cracking or swelling, adhering firmly onto the substrate. The specific resistance of the insulating film pattern was found as being $10 \times 10^{15}$ Ωcm or more.

Example 8

10 g of silicone polymer represented by the aforementioned (C-1) and having an average molecular weight of 1,000 and 0.2 g of silicone polymer represented by the aforementioned (B-15) and having an average molecular weight of 1,100 were dissolved in methylisobutyl ketone to prepare a 20% solution of silicone polymer (a photosensitive composition).

Then, the photosensitive composition thus obtained was spin-coated on a silicon wafer and baked at a temperature of 100° C. for one minute to form a photosensitive composition film having a thickness of 2 μm.

ArF laser beam was then irradiated at a dosage of 500 mJ/cm$^2$ onto the surface of the photosensitive composition film, thereby performing a selective exposure of the photosensitive composition film. Thereafter, the photosensitive composition film was developed in a 2.38 wt. % aqueous solution of tetramethyl ammonium hydroxide at a temperature of 25° C. for one minute thereby to remove the non-exposed portion, thus obtaining a negative pattern having a width of 2 μm. The entire upper surface of the pattern was irradiated with ultraviolet rays using a low pressure mercury lamp as a light source at a dosage of 1 J/cm$^2$, and then heat-treated at a temperature of 300° C. for one hour, thereby obtaining an insulating film pattern which was formed of a glass matrix containing siloxane bond.

The insulating film pattern thus obtained was found free from cracking or swelling, adhering firmly onto the substrate. The specific resistance of the insulating film pattern was found as being $10 \times 10^{15}$ Ωcm or more.

Example 9

10 g of silicone polymer represented by the aforementioned C-1) and having an average molecular weight of 9,000 and 0.2 g of silicone polymer represented by the aforementioned (B-3) and having an average molecular weight of 10,000 were dissolved in methylisobutyl ketone to prepare a 20% solution of silicone polymer (a photosensitive composition).

Then, the photosensitive composition thus obtained was spin-coated on a silicon wafer and baked at a temperature of 100° C. for one minute to form a photosensitive composition film having a thickness of 2 μm.

ArF laser beam was then irradiated at a dosage of 500 mJ/cm$^2$ onto the surface of the photosensitive composition film, thereby performing a selective exposure of the photosensitive composition film. Thereafter, the photosensitive composition film was developed in a 2.38 wt. % aqueous solution of tetramethyl ammonium hydroxide at a temperature of 25° C. for one minute thereby to remove the non-exposed portion, thus obtaining a negative pattern having a width of 2 μm. The pattern was then heat-treated at a temperature of 300° C. for one hour, thereby obtaining an insulating film pattern which was formed of a glass matrix containing siloxane bond.

The insulating film pattern thus obtained was found free from cracking or swelling, adhering firmly onto the substrate. The specific resistance of the insulating film pattern was found as being $10 \times 10^{15}$ Ωcm or more.

Example 10

10 g of silicone polymer represented by the aforementioned (C-1) and having an average molecular weight of 9,000 and 0.2 g of silicone polymer represented by the aforementioned (B-1) and having an average molecular weight of 10,000 were dissolved in methylisobutyl ketone to prepare a 20% solution of silicone polymer (a photosensitive composition).

Then, the photosensitive composition thus obtained was spin-coated on a silicon wafer and baked at a temperature of 100° C. for one minute to form a photosensitive composition film having a thickness of 2 μm.

ArF laser beam was then irradiated at a dosage of 500 mJ/cm$^2$ onto the surface of the photosensitive composition film, thereby performing a selective exposure of the photosensitive composition film. Thereafter, the photosensitive composition film was developed in a 2.38 wt. % aqueous solution of tetramethyl ammonium hydroxide at a temperature of 25° C. for one minute thereby to remove the non-exposed portion, thus obtaining a negative pattern having a width of 2 μm. The pattern was then heat-treated at a temperature of 300° C. for one hour, thereby obtaining an insulating film pattern which was formed of a glass matrix containing siloxane bond.

The insulating film pattern thus obtained was found free from cracking or swelling, adhering firmly onto the substrate. The specific resistance of the insulating film pattern was found as being $10 \times 10^{15}$ Ωcm or more.

Example 11

5 g of silicone polymer represented by the aforementioned (A-1) and having an average molecular weight of 10,000, 5 g of silicone polymer represented by the aforementioned (C-1) and having an average molecular weight of 9,000 and 0.2 g of silicone polymer represented by the aforementioned (B-15) and having an average molecular weight of 4,000 were dissolved in toluene to prepare a 20% solution of silicone polymer (a photosensitive composition).

Then, the photosensitive composition thus obtained was spin-coated on a silicon wafer and baked at a temperature of 100° C. for one minute to form a photosensitive composition film having a thickness of 2 μm.

ArF laser beam was then irradiated at a dosage of 500 mJ/cm$^2$ onto the surface of the photosensitive composition film, thereby performing a selective exposure of the photosensitive composition film. Thereafter, the photosensitive composition film was developed in a 2.38 wt. % aqueous solution of tetramethyl ammonium hydroxide at a temperature of 25° C. for one minute thereby to remove the non-exposed portion, thus obtaining a negative pattern having a width of 2 μm. The entire upper surface of the pattern was irradiated with ultraviolet rays using a low pressure mercury lamp as a light source at a dosage of 1 J/cm$^2$, and then heat-treated at a temperature of 300° C. for one hour, thereby obtaining an insulating film pattern which was formed of a glass matrix containing siloxane bond.

The insulating film pattern thus obtained was found free from cracking or swelling, adhering firmly onto the substrate. The specific resistance of the insulating film pattern was found as being $10 \times 10^{15}$ Ωcm or more.

Example 12

5 g of silicone polymer represented by the aforementioned (A-1) and having an average molecular weight of 10,000, 5 g of silicone polymer represented by the aforementioned (C-1) and having an average molecular weight of 9,000 and 0.2 g of silicone polymer represented by the aforementioned (B-3) and having an average molecular weight of 4,000 were dissolved in toluene to prepare a 20% solution of silicone polymer (a photosensitive composition).

Then, the photosensitive composition thus obtained was spin-coated on a silicon wafer and baked at a temperature of 100° C. for one minute to form a photosensitive composition film having a thickness of 2 μm.

ArF laser beam was then irradiated at a dosage of 500 mJ/cm$^2$ onto the surface of the photosensitive composition film, thereby performing a selective exposure of the photosensitive composition film. Thereafter, the photosensitive composition film was developed in a 2.38 wt. % aqueous solution of tetramethyl ammonium hydroxide at a temperature of 25° C. for one minute thereby to remove the non-exposed portion, thus obtaining a negative pattern having a width of 2 μm. The entire upper surface of the pattern was irradiated with ultraviolet rays using a low pressure mercury lamp as a light source at a dosage of 1 J/cm$^2$, and then heat-treated at a temperature of 300° C. for one hour, thereby obtaining an insulating film pattern which was formed of a glass matrix containing siloxane bond.

The insulating film pattern thus obtained was found free from cracking or swelling, adhering firmly onto the substrate. The specific resistance of the insulating film pattern was found as being 10×10$^{15}$ Ωcm or more.

Example 13

Figure 2B:
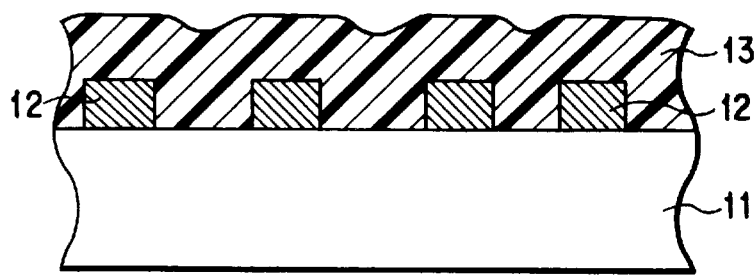

First of all, as shown in FIG. 2A, an aluminum wiring 12 having a thickness of 1 μm and a width of 2 μm was formed at intervals of 2 μm on a substrate 11. Then, the same photosensitive composition as employed in Example 1 was spin-coated on the substrate 11 provided with the aluminum wiring 12 and dried to form a photosensitive composition film 13 having a thickness of 2 μm as shown in FIG. 2B.

Figure 2C:
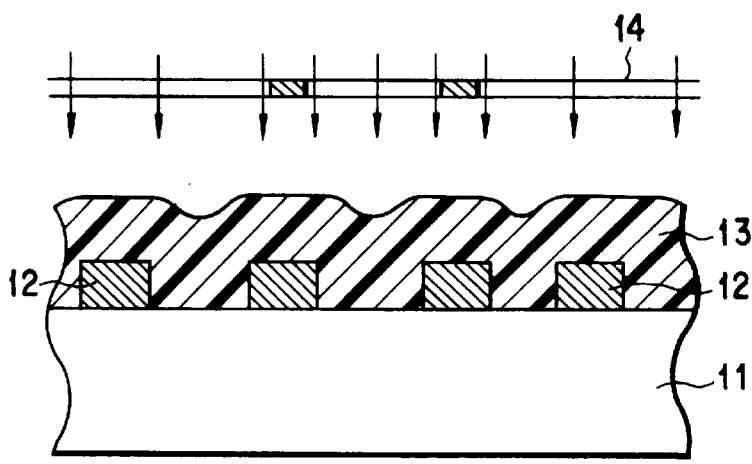
Figure 2D:
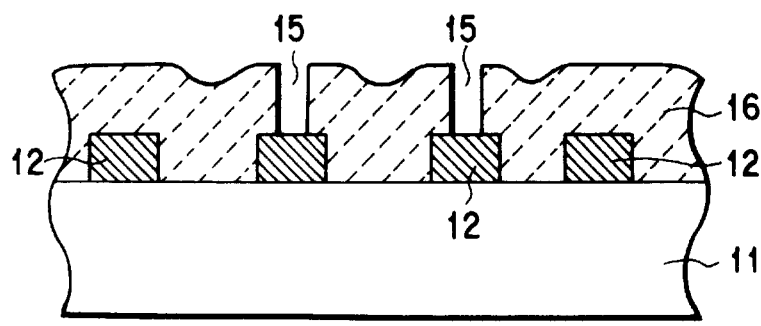

Then, as shown in FIG. 2C, ultraviolet rays were irradiated from a low pressure mercury lamp at a dosage of 500 mJ/cm$^2$ onto the surface of the photosensitive composition film 13 through a mask pattern 14, thereby performing a selective exposure of the photosensitive composition film 13. Thereafter, the photosensitive composition film 13 was heat-treated at a temperature of 130° C. for 10 minutes and then developed with xylene for 40 seconds thereby to obtain a negative pattern. Then, the pattern was heat-treated again at a temperature of 450° C. for one hour, thereby obtaining an insulating film pattern 16 which was formed of a glass matrix and provided, at a portion corresponding with the location of wiring 12, with a through-hole 15 having a dimension of 0.7 μm×1 μm as shown in FIG. 2D.

The insulating film pattern 16 thus obtained was found free from cracking or swelling, adhering firmly onto the substrate 1. Further, any sign of reflow was not recognized around the opening of the through-hole 15. The specific resistance of the insulating film pattern 16 was found as being 5×10$^{14}$ Ωcm.

Example 14

10 g of silicone polymer represented by the aforementioned (A-1) and having an average molecular weight of 20,000, and 10 g of silicone polymer represented by the aforementioned (B-2) and having an average molecular weight of 10,000 were dissolved in xylene to prepare a 20% solution of silicone polymer, to which 5 wt % of acetylacenato zirconium was added to prepare a photosensitive composition.

On the other hand, an aluminum wiring having a thickness of 1 μm and a width of 2 μm was formed at intervals of 2 μm on a substrate. Then, the aforementioned photosensitive composition was spin-coated on the substrate provided with the aluminum wiring and dried to form a photosensitive composition film having a thickness of 2 μm.

Then, ultraviolet rays were irradiated from a low pressure mercury lamp at a dosage of 250 mJ/cm$^2$ onto the surface of the photosensitive composition film through a mask pattern, thereby performing a selective exposure of the photosensitive composition film. Thereafter, the photosensitive composition film was heat-treated at a temperature of 150° C. for 10 minutes and then developed with xylene for 40 seconds thereby to obtain a negative pattern provided, at a portion corresponding with the location of the wiring, with a through-hole having a dimension of 0.7 μm×1 μm. Then, the pattern was heat-treated again at a temperature of 450° C. for one hour, thereby obtaining an insulating film pattern composed of a glass matrix.

The insulating film pattern thus obtained was found free from cracking or swelling, adhering firmly onto the substrate. Further, the through-hole thus formed was sharp in sectional shape, indicating no sign of reflow around the opening of the through-hole. The specific resistance of the insulating film pattern was found as being 2×10$^{14}$ Ωcm.

Example 15

First of all, as shown in FIG. 2A, an aluminum wiring 12 having a thickness of 1μm and a width of 2 μm was formed at intervals of 2 μm on a substrate 11. Then, the same photosensitive composition as employed in Example 4 was spin-coated on the substrate 11 provided with the aluminum wiring 12 and dried to form a photosensitive composition film 13 having a thickness of 2 μm as shown in FIG. 2B.

Then, as shown in FIG. 2C, ultraviolet rays were irradiated from a low pressure mercury lamp at a dosage of 500 mJ/cm$^2$ onto the surface of the photosensitive composition film 13 through a mask pattern 14, thereby performing a selective exposure of the photosensitive composition film 13. Thereafter, the photosensitive composition film 13 was heat-treated at a temperature of 130° C. for 10 minutes and then developed with xylene for 40 seconds thereby to obtain a negative pattern. Then, the pattern was heat-treated again at a temperature of 450° C. for one hour, thereby obtaining an insulating film pattern 16 which was formed of a glass matrix and provided, at a portion corresponding with the location of wiring 12, with a through-hole 15 having a dimension of 0.7 μm×1μm as shown in FIG. 2D.

The insulating film pattern 16 thus obtained was found free from cracking or swelling, adhering firmly onto the substrate 1. Further, any sign of reflow was not recognized around the opening of the through-hole 15. The specific resistance of the insulating film pattern 16 was found as being 5×10$^{14}$ Ωcm.

Example 16

10 g of silicone polymer represented by the aforementioned (A-1) and having an average molecular weight of 300, and 10 g of silicone polymer represented by the aforementioned (B-2) and having an average molecular weight of 20,000 were dissolved in xylene to prepare a 20% solution of silicone polymer, to which 5 wt % of acetylacenato zirconium was added to prepare a photosensitive composition.

On the other hand, an aluminum wiring having a thickness of 1 μm and a width of 2 μm was formed at intervals of 2 μm on a substrate. Then, the aforementioned photosensitive composition was spin-coated on the substrate provided with the aluminum wiring and dried to form a photosensitive composition film having a thickness of 2 μm.

Then, ultraviolet rays were irradiated from a low pressure mercury lamp at a dosage of 250 mJ/cm$^2$ onto the surface of the photosensitive composition film through a mask pattern, thereby performing a selective exposure of the photosensitive composition film. Thereafter, the photosensitive composition film was heat-treated at a temperature of 150° C. for 5 minutes and then developed with xylene for 40 seconds thereby to obtain a negative pattern provided, at a portion corresponding with the location of the wiring, with a through-hole having a dimension of 0.7 $\mu$m×1 $\mu$m. Then, the pattern was heat-treated again at a temperature of 450° C. for one hour, thereby obtaining an insulating film pattern composed of a glass matrix.

The insulating film pattern thus obtained was found free from cracking or swelling, adhering firmly onto the substrate. Further, the through-hole thus formed was sharp in sectional shape, indicating no sign of reflow around the opening of the through-hole. The specific resistance of the insulating film pattern was found as being $2\times10^{14}$ $\Omega$cm.

Example 17

5 g of silicone polymer represented by the aforementioned (A-1) and having an average molecular weight of 20,000, 5 g of silicone polymer represented by the aforementioned (C-1) and having an average molecular weight of 9,000, and 5 g of silicone polymer represented by the aforementioned (B-15) and having an average molecular weight of 4,000 were dissolved in toluene to prepare a 20% solution of silicone polymer (a photosensitive composition).

Then, the photosensitive composition thus obtained was spin-coated on a silicon wafer and baked at a temperature of 100° C. for one minute to form a photosensitive composition film having a thickness of 2 $\mu$m.

ArF laser beam was then irradiated at a dosage of 1 J/cm$^2$ onto the surface of the photosensitive composition film, thereby performing a selective exposure of the photosensitive composition film. After being post-baked at a temperature of 100° C. for one minute, the photosensitive composition film was developed for one minute in a xylene solution thereby to remove the non-exposed portion, thus obtaining a negative pattern having a width of 2 $\mu$m. The entire upper surface of the pattern was irradiated with ultraviolet rays using a low pressure mercury lamp as a light source at a dosage of 1 J/cm$^2$, and then heat-treated at a temperature of 300° C. for one hour, thereby obtaining an insulating film pattern which was formed of a glass matrix containing siloxane bond.

The insulating film pattern thus obtained was found free from cracking or swelling, adhering firmly onto the substrate. The specific resistance of the insulating film pattern was found as being $10\times10^{15}$ $\Omega$cm or more.

Example 18

First of all, as shown in FIG. 2A, an aluminum wiring 12 having a thickness of 1 $\mu$m and a width of 2 $\mu$m was formed at intervals of 2 $\mu$m on a substrate 11. Then, the same photosensitive composition as employed in Example 1 was spin-coated on the substrate 11 provided with the aluminum wiring 12 and dried to form a photosensitive composition film 13 having a thickness of 2 $\mu$m as shown in FIG. 2B.

Then, as shown in FIG. 2C, ultraviolet rays were irradiated from a low pressure mercury lamp at a dosage of 500 mJ/cm$^2$ onto the surface of the photosensitive composition film 13 through a mask pattern 14, thereby performing a selective exposure of the photosensitive composition film 13. Thereafter, the photosensitive composition film 13 was developed with xylene for 40 seconds thereby to obtain a negative pattern. Then, the pattern was heat-treated again at a temperature of 450° C. for one hour, thereby obtaining an insulating film pattern 16 which was formed of a glass matrix and provided, at a portion corresponding with the location of wiring 12, with a through-hole 15 having a dimension of 0.7 $\mu$m×1 $\mu$m as shown in FIG. 2D.

The insulating film pattern 16 thus obtained was found free from cracking or swelling, adhering firmly onto the substrate 1. Further, any sign of reflow was not recognized around the opening of the through-hole 15. The specific resistance of the insulating film pattern 16 was found as being $5\times10^{14}$ $\Omega$cm.

Example 19

10 g of silicone polymer represented by the aforementioned (A-1) and having an average molecular weight of 20,000 was dissolved in toluene to prepare a 20% solution of silicone polymer (a photosensitive composition).

Then, the photosensitive composition thus obtained was spin-coated on a silicon wafer and baked at a temperature of 100° C. for one minute to form a photosensitive composition film having a thickness of 2 $\mu$m.

ArF laser beam was then irradiated at a dosage of 500 mJ/cm$^2$ onto the surface of the photosensitive composition film, thereby performing a selective exposure of the photosensitive composition film. Thereafter, the photosensitive composition film was developed in a 2.38 wt. % aqueous solution of tetramethyl ammonium hydroxide at a temperature of 25° C. for one minute thereby to remove the non-exposed portion, thus obtaining a negative pattern having a width of 2 $\mu$m. The pattern was then heat-treated at a temperature of 300° C. for one hour, thereby obtaining an insulating film pattern which was formed of a glass matrix containing siloxane bond.

The insulating film pattern thus obtained was found free from cracking or swelling, adhering firmly onto the substrate. The specific resistance of the insulating film pattern was found as being $10\times10^{14}$ $\Omega$cm or more.

Example 20

10 g of silicone polymer represented by the aforementioned (C-1) and having an average molecular weight of 9,000 was dissolved in methylisobutyl ketone to prepare a 20% solution of silicone polymer (a photosensitive composition).

Then, the photosensitive composition thus obtained was spin-coated on a silicon wafer and baked at a temperature of 100° C. for one minute to form a photosensitive composition film having a thickness of 2 $\mu$m.

ArF laser beam was then irradiated at a dosage of 500 mJ/cm$^2$ onto the surface of the photosensitive composition film, thereby performing a selective exposure of the photosensitive composition film. Thereafter, the photosensitive composition film was developed in a 2.38 wt. % aqueous solution of tetramethyl ammonium hydroxide at a temperature of 25° C. for 40 seconds thereby to remove the non-exposed portion, thus obtaining a negative pattern having a width of 2 $\mu$m. The pattern was then heat-treated at a temperature of 300° C. for one hour, thereby obtaining an insulating film pattern which was formed of a glass matrix containing siloxane bond.

The insulating film pattern thus obtained was found free from cracking or swelling, adhering firmly onto the substrate. The specific resistance of the insulating film pattern was found as being $10\times10^{15}$ $\Omega$cm or more.

Example 21

10 g of silicone polymer represented by the aforementioned (C-1) and having an average molecular weight of 10,000, and silicone polymer represented by the aforementioned (B-15) and having an average molecular weight of 4,000 were dissolved in methyl isobutyl ketone to prepare a 20% solution of silicone polymer (a photosensitive composition).

Then, the photosensitive composition thus obtained was spin-coated on a silicon wafer and baked at a temperature of 100° C. for one minute to form a photosensitive composition film having a thickness of 2 μm.

ArF laser beam was then irradiated at a dosage of 500 mJ/cm² onto the surface of the photosensitive composition film, thereby performing a selective exposure of the photosensitive composition film. Thereafter, the photosensitive composition film was developed in a 2.38 wt. % aqueous solution of tetramethyl ammonium hydroxide at a temperature of 25° C. for one minute thereby to remove the exposed portion, thus obtaining a positive pattern. The pattern was then heat-treated at a temperature of 300° C. for one hour, thereby obtaining an insulating film pattern which was formed of a glass matrix containing siloxane bond.

The insulating film pattern thus obtained was found free from cracking or swelling, adhering firmly onto the substrate. The specific resistance of the insulating film pattern was found as being 10×10¹⁵ Ωcm or more.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A method of forming an insulating film pattern, which comprises the steps of;

coating a photosensitive composition comprising silicone polymer having a unit structure represented by the following general formula (III) and a silicon polymer having a unit structure represented by the following general formula (II) on a substrate thereby to form a film of photosensitive composition;

selectively exposing and developing said film of photosensitive composition to obtain a pattern of said film of photosensitive composition; and heat-treating said pattern after said development at a temperature at which an insulating film pattern is formed;

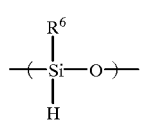
(III)

wherein R⁶ is hydrogen atom, a substituted or unsubstituted alkyl group, a substituted or unsubstituted aromatic group or a siloxane bond;

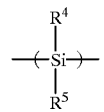
(II)

wherein R⁴ and R⁵ may be the same or different and are individually hydrogen atom, a substituted or unsubstituted alkyl group or a substituted or unsubstituted aromatic group.

2. The method according to claim 1, wherein said temperature at which the insulating film pattern is formed is from 200° C. to 600° C.

3. A method of forming an insulating film pattern, which comprises the steps of;

coating a photosensitive composition comprising a silicon polymer having a unit structure represented by the following general formula (I), silicone polymer having a unit structure represented by the following general formula (III) and a silicon polymer having a unit structure represented by the following general formula (II) on a substrate thereby to form a film of photosensitive composition;

selectively exposing and developing said film of photosensitive composition to obtain a pattern of said film of photosensitive composition; and heat-treating said pattern after said development at a temperature at which an insulating film pattern is formed;

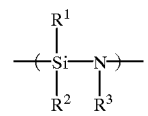
(I)

wherein R¹, R² and R³ may be the same or different and are individually hydrogen atom, a substituted or unsubstituted alkyl group or a substituted or unsubstituted aromatic group;

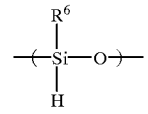
(III)

wherein R⁶ is hydrogen atom, a substituted or unsubstituted alkyl group, a substituted or unsubstituted aromatic group or a siloxane bond;

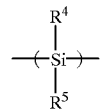
(II)

wherein R⁴ and R⁵ may be the same or different and are individually hydrogen atom, a substituted or unsubstituted alkyl group or a substituted or unsubstituted aromatic group.

4. The method according to claim 3, wherein said temperature at which the insulating film pattern is formed is from 200° C. to 600° C.

5. A method of forming an insulating film pattern, which comprises the steps of:

coating a photosensitive composition comprising a silicon polymer having a unit structure represented by the following general formula (I) and a silicon polymer having a unit structure represented by the following general formula (II) on a substrate thereby to form a film of photosensitive composition;

selectively exposing said film of photosensitive composition and then heat-treating said film of photosensitive composition;

developing said film of photosensitive composition to obtain a pattern of said film of photosensitive composition; and heat-treating said pattern after said development at a temperature at which an insulating film pattern is formed:

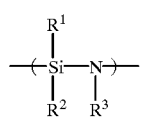
(I)

wherein $R^1$, $R^2$ and $R^3$ may be the same or different and are individually hydrogen atom, a substituted or unsubstituted alkyl group or a substituted or unsubstituted aromatic group;

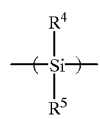
(II)

wherein $R^4$ and $R^5$ may be the same or different and are individually hydrogen atom, a substituted or unsubstituted alkyl group or a substituted or unsubstituted aromatic group.

6. The method according to claim 5, wherein said temperature at which the insulating film pattern is formed is from 200° C. to 600° C.

7. The method according to claim 5, wherein said heat-treating step forms Si—O—Si bonds in said insulating film pattern.

8. A method of forming an insulating film pattern, which comprises the steps of;

coating a photosensitive composition comprising silicone polymer having a unit structure represented by the following general formula (III) and a silicon polymer having a unit structure represented by the following general formula (II) on a substrate thereby to form a film of photosensitive composition;

selectively exposing said film of photosensitive composition and then heat-treating said film of photosensitive composition;

developing said film of photosensitive composition to obtain a pattern of said film of photosensitive composition; and heat-treating said pattern after said development at a temperature at which an insulating film pattern is formed:

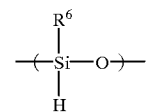
(III)

wherein $R^6$ is hydrogen atom, a substituted or unsubstituted alkyl group, a substituted or unsubstituted aromatic group or a siloxane bond;

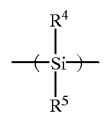
(II)

wherein $R^4$ and $R^5$ may be the same or different and are individually hydrogen atom, a substituted or unsubstituted alkyl group or a substituted or unsubstituted aromatic group.

9. The method according to claim 8, wherein said temperature at which the insulating film pattern is formed is from 200° C. to 600° C.

10. A method of forming an insulating film pattern, which comprises the steps of;

coating a photosensitive composition comprising a silicon polymer having a unit structure represented by the following general formula (I), silicone polymer having a unit structure represented by the following general formula (III) and a silicon polymer having a unit structure represented by the following general formula (II) on a substrate thereby to form a film of photosensitive composition;

selectively exposing said film of photosensitive composition and then heat-treating said film of photosensitive composition;

developing said film of photosensitive composition to obtain a pattern of said film of photosensitive composition; and heat-treating said pattern after said development at a temperature at which an insulating film pattern is formed:

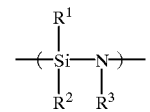
(I)

wherein $R^1$, $R^2$ and $R^3$ may be the same or different and are individually hydrogen atom, a substituted or unsubstituted alkyl group or a substituted or unsubstituted aromatic group;

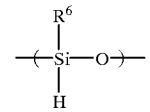
(III)

wherein $R^6$ is hydrogen atom, a substituted or unsubstituted alkyl group, a substituted or unsubstituted aromatic group or a siloxane bond;

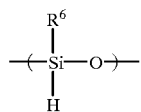
(III)

wherein $R^4$ and $R^5$ may be the same or different and are individually hydrogen atom, a substituted or unsubstituted alkyl group or a substituted or unsubstituted aromatic group.

11. The method according to claim 10, wherein said temperature at which the insulating film pattern is formed is from 200° C. to 600° C.

12. A method of forming an insulating film pattern, which comprises the steps of;

coating a photosensitive composition comprising at least one polymer selected from a silicon polymer having a unit structure represented by the following general formula (1) and silicone polymer having a unit structure represented by the following general formula (III) on a substrate thereby to form a film of photosensitive composition;

selectively exposing said film of photosensitive composition and then alkali-developing said film of photosensitive composition; and heat-treating said pattern after said development at a temperature at which an insulating film pattern is formed:

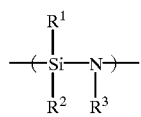
(I)

wherein $R^1$, $R^2$ and $R^3$ may be the same or different and are individually hydrogen atom, a substituted or unsubstituted alkyl group or a substituted or unsubstituted aromatic group;

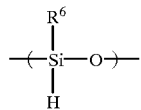
(III)

wherein $R^6$ is hydrogen atom, a substituted or unsubstituted alkyl group, a substituted or unsubstituted aromatic group or a siloxane bond.

13. The method according to claim 12, wherein said temperature at which the insulating film pattern is formed is from 200° C. to 600° C.

14. A method of forming an insulating film pattern which comprises the steps of:

coating a photosensitive composition comprising a silicon polymer having a unit structure represented by the following general formula (I) and a silicon polymer having a unit structure represented by the following general formula (II) on a substrate thereby to form a film of photosensitive composition;

selectively exposing and developing said film of photosensitive composition to obtain a pattern of said film of photosensitive composition; and heat-treating said pattern after said development at a temperature at which an insulating film pattern is formed:

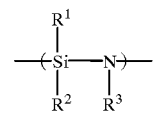

wherein $R^1$, $R^2$ and $R^3$ may be the same or different and are individually hydrogen atom, a substituted or unsubstituted alkyl group or a substituted or unsubstituted aromatic group:

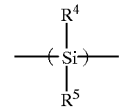

wherein $R^4$ and $R^5$ may be the same or different and are individually hydrogen atom, a substituted or unsubstituted alkyl group or a substituted or unsubstituted aromatic group wherein said temperature at which the insulating film pattern is formed is from 200° C. to 600° C.

15. The method according to claim 14, wherein said heat-treating step forms Si—O—Si bonds in said insulating film pattern.

* * * * *